United States Patent
Kondo

(10) Patent No.: US 11,280,839 B2
(45) Date of Patent: Mar. 22, 2022

(54) METHODS AND APPARATUS FOR A BATTERY

(71) Applicant: SEMICONDUCTOR COMPONENTS INDUSTRIES, LLC, Phoenix, AZ (US)

(72) Inventor: Hideo Kondo, Oizumi-Machi (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 185 days.

(21) Appl. No.: 16/853,063

(22) Filed: Apr. 20, 2020

(65) Prior Publication Data
US 2021/0325464 A1 Oct. 21, 2021

(51) Int. Cl.
*G01R 31/367* (2019.01)
*G01R 31/3835* (2019.01)
*H02J 7/00* (2006.01)

(52) U.S. Cl.
CPC ....... *G01R 31/367* (2019.01); *G01R 31/3835* (2019.01); *H02J 7/0048* (2020.01)

(58) Field of Classification Search
None
See application file for complete search history.

(56) References Cited

U.S. PATENT DOCUMENTS

| | | |
|---|---|---|
| 2007/0148532 A1 | 6/2007 | Lim |
| 2016/0085913 A1 | 3/2016 | Lupo |
| 2017/0141589 A1 | 5/2017 | Inoue |
| 2020/0371163 A1* | 11/2020 | Du ................ G01R 31/367 |

* cited by examiner

*Primary Examiner* — Jas A Sanghera
(74) *Attorney, Agent, or Firm* — Dickinson Wright PLLC

(57) ABSTRACT

Various embodiments of the present technology may provide methods and apparatus for a battery. The apparatus may compute a state of charge (SOC) of the battery using a coulomb counting method and adjust the computed SOC based on an extracted SOC. The apparatus may determine whether the battery is in an open circuit condition and, if so, the extracted SOC is determined during the open circuit period.

20 Claims, 7 Drawing Sheets

METHODS AND APPARATUS FOR A BATTERY

BACKGROUND OF THE TECHNOLOGY

"Battery capacity" is a measure (typically in ampere-hours) of the charge stored by the battery and is determined by the mass of active material contained in the battery. The battery capacity represents the maximum amount of energy that can be extracted from the battery under certain specified conditions. The battery capacity can also be represented as a percentage and referred to as a state of charge (SOC) or a relative state of charge (RSOC).

A fuel gauge is typically provided to measure various parameters of the battery and monitor the state of charge of the battery. Convention approaches using the current of the battery (referred to as the "coulomb counting" method) to compute the state of charge may suffer from measurement errors due to uncertainty of an initial SOC, uncertainly in the battery capacity (in ampere-hours), and errors in the measured coulomb count due to errors in measuring the current and errors in time differences due to noise and oscillator inaccuracies/drifts.

SUMMARY OF THE INVENTION

Various embodiments of the present technology may provide methods and apparatus for a battery. The apparatus may compute a state of charge (SOC) of the battery using a coulomb counting method and adjust the computed SOC based on an extracted SOC. The apparatus may determine whether the battery is in an open circuit condition and, if so, the extracted SOC is determined during the open circuit period.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, timers, memory devices, switches, semiconductor devices, such as transistors and capacitors, and the like, which may carry out a variety of functions. In addition, the present technology may be integrated in any number of electronic systems, such as automotive, aviation, "smart devices," portables, e-cigarettes, aroma therapy puff systems, vaping devices, and consumer electronics, and the systems described are merely exemplary applications for the technology.

Figure 1:
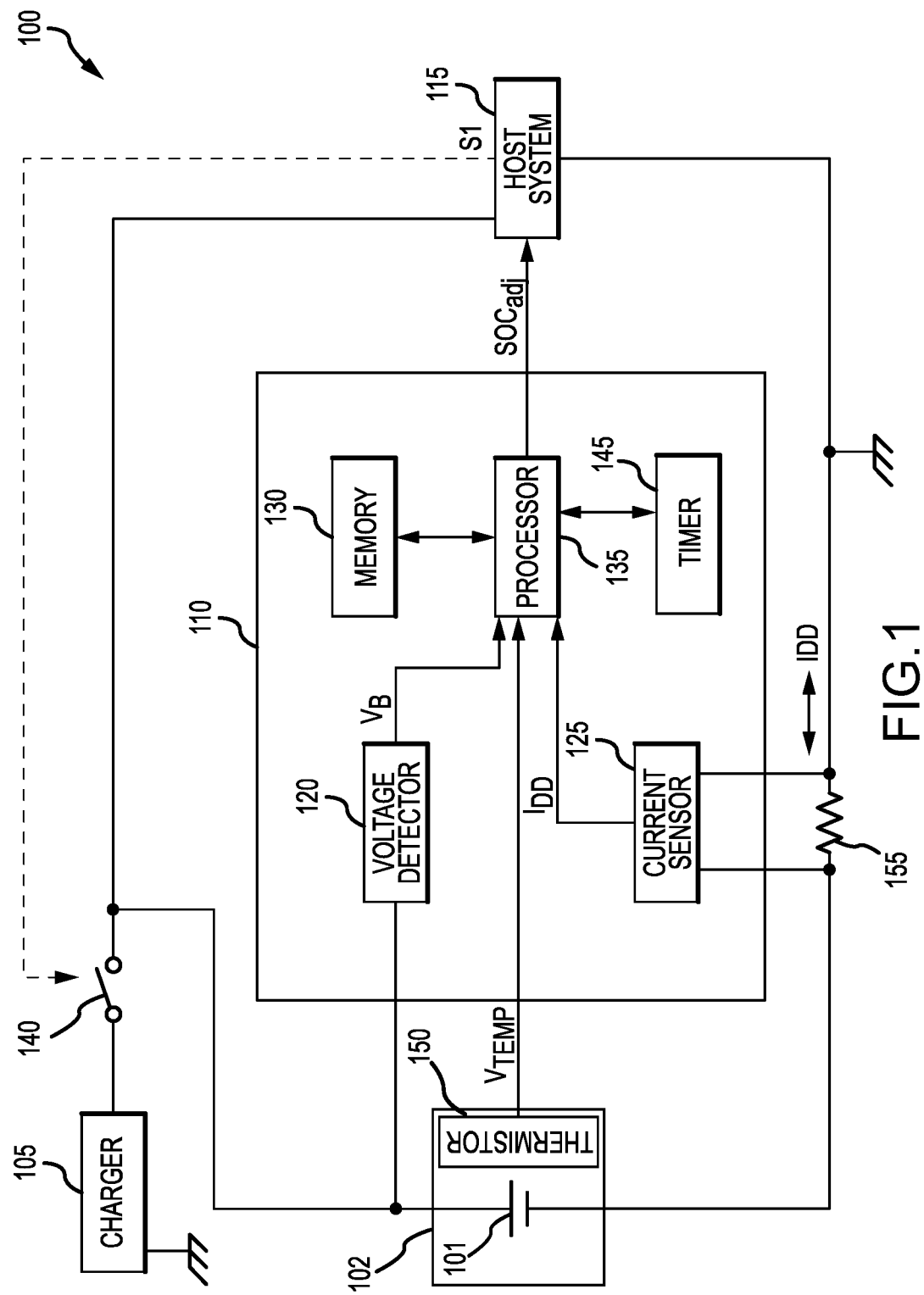
FIG. 1 is a block diagram of a battery system in accordance with an exemplary embodiment of the present technology.
Figure 2:
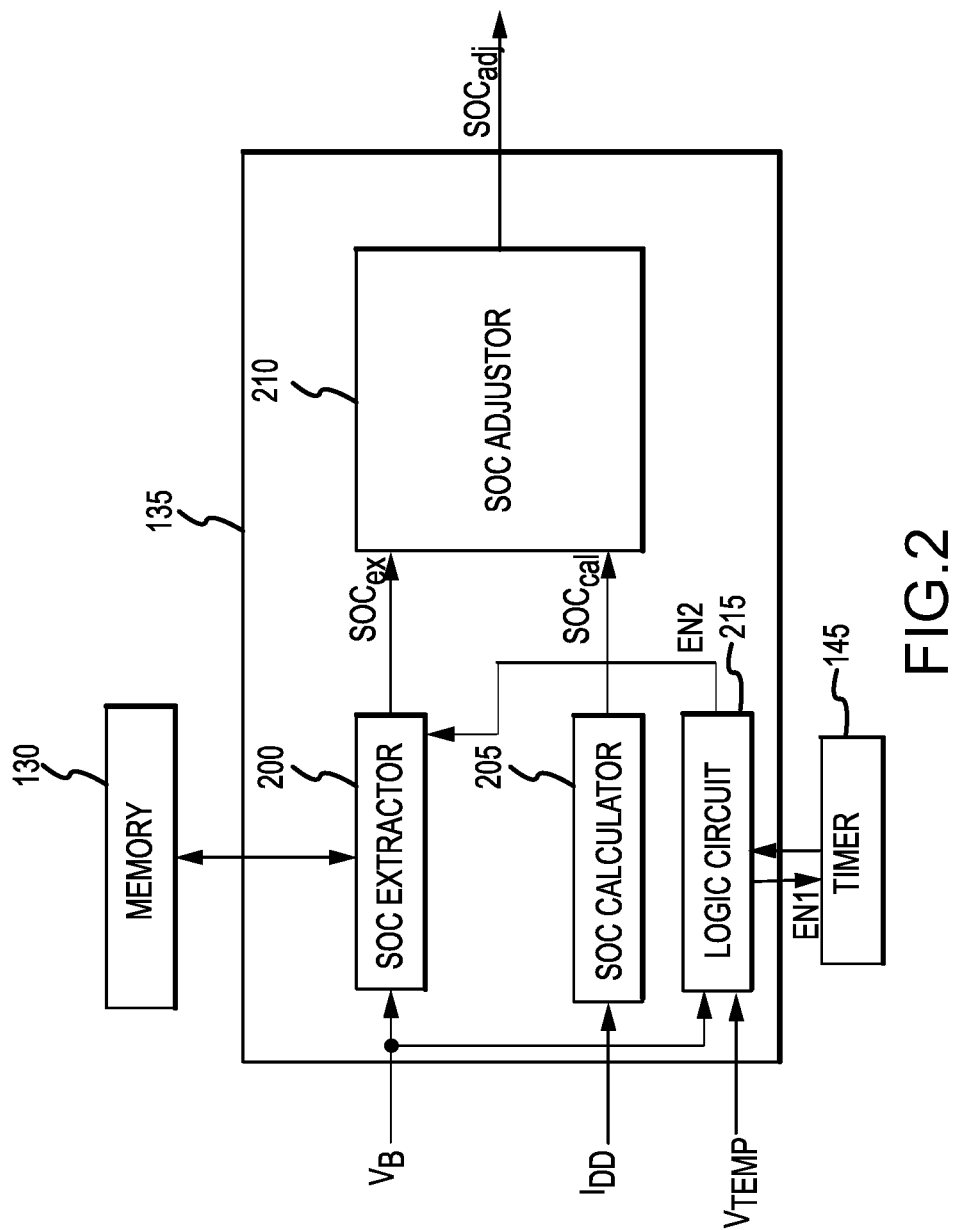
FIG. 2 is a simplified circuit diagram of a processor in accordance with an exemplary embodiment of the present technology.

Methods and apparatus for a battery according to various aspects of the present technology may operate in conjunction with any suitable electronic system and/or device, such as "smart devices," wearables, battery-powered consumer electronics, portable devices, battery-powered vehicles, and the like. Referring to FIG. 1, an exemplary system 100 may be integrated in an electronic device (not shown), such as a vaping device or an electric vehicle, powered by a rechargeable battery 101, such as a lithium ion battery. For example, in various embodiments, the battery 101 may operate in conjunction with a charger 105 and a fuel gauge circuit 110 to provide power to a host system 115 (i.e., a load).

According to an exemplary embodiment, the system 100 may comprise a switch 140 to selectively connect/disconnect the charger 105 to/from the battery 101. According to an exemplary embodiment, the host system 115 may operate the switch 140 according to a control signal S1 that is pulse-width modulated. The switch 140, in conjunction with the control signal S1, may control current flow from the charger 105 to the battery 101, and thus control charging of the battery 101. The switch 140 may comprise a transistor or any other device suitable for controlling (enabling or disabling) current flow.

In various embodiments, the system 100 may comprise a battery pack 102 comprising the battery 101 and a temperature sensor, such as a thermistor 150. The thermistor 150 may detect a temperature of the battery 101 and generate a voltage $V_{TEMP}$ that represents the temperature. Accordingly, the thermistor 150 may be in close proximity to the battery 101.

The battery pack 102 may comprise two terminals that correspond to terminals of the battery 101 (i.e., positive and negative battery terminals) and a third terminal to connect the thermistor 150 to the fuel gauge circuit 110

The fuel gauge circuit 110 may be configured to manage various battery operations and monitor various battery conditions. For example, the fuel gauge circuit 110 may be configured to measure a voltage $V_B$ of the battery 101, measure a current $I_{DD}$, compute a remaining capacity (also expressed as a percentage and referred to as the state of charge SOC) of the battery 101, compute a state of health (SOH) of the battery 101, estimate a lifespan of the battery 101, determine an energy capability of the battery, and the like. In an exemplary embodiment, the fuel gauge circuit 110 may comprise a voltage detector 120, a current sensor 125, and a processor 135.

Figure 6:
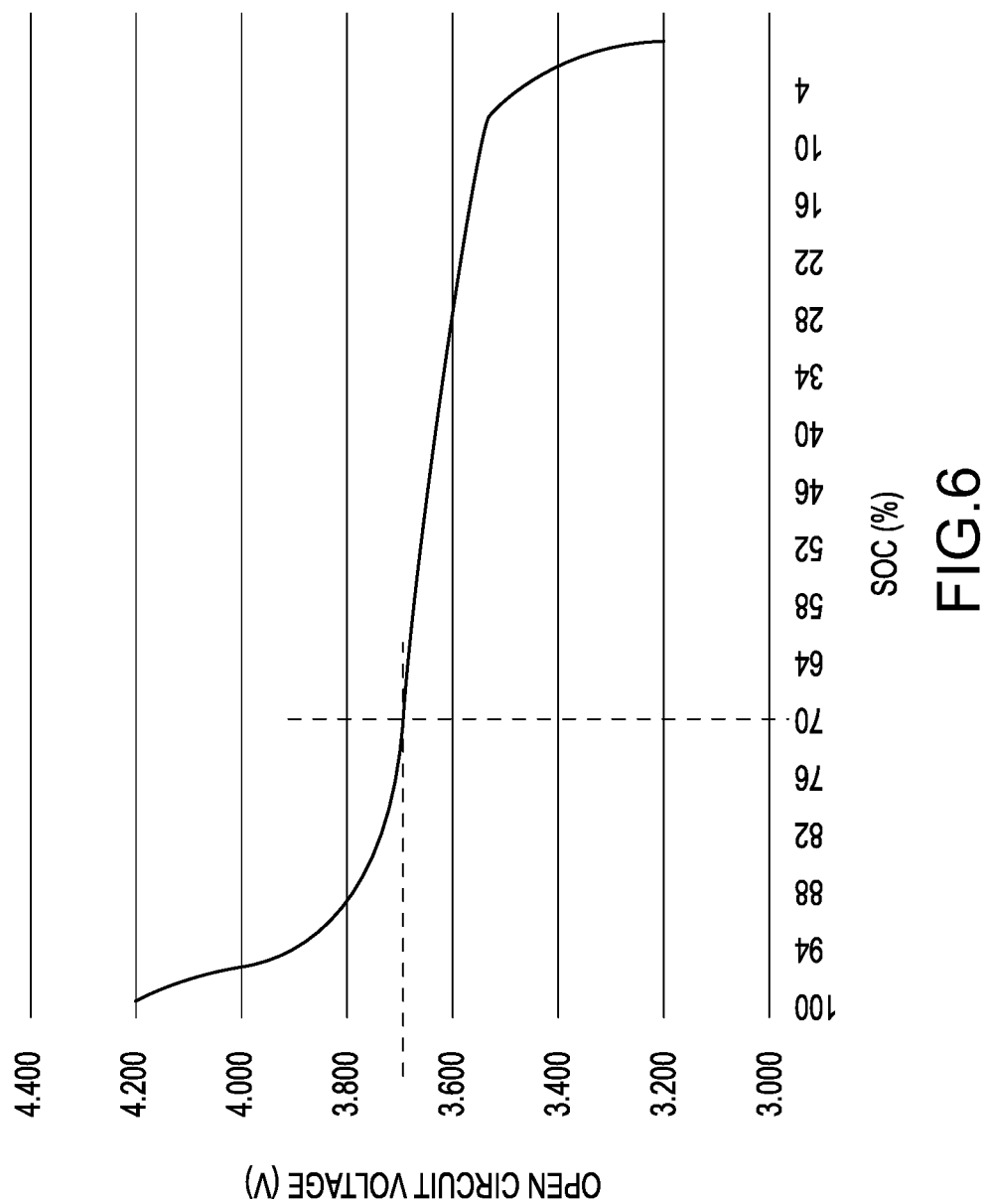
FIG. 6 is a graph illustrating open circuit voltage as a function of state of charge in accordance with an exemplary embodiment of the present technology.
Figure 7:
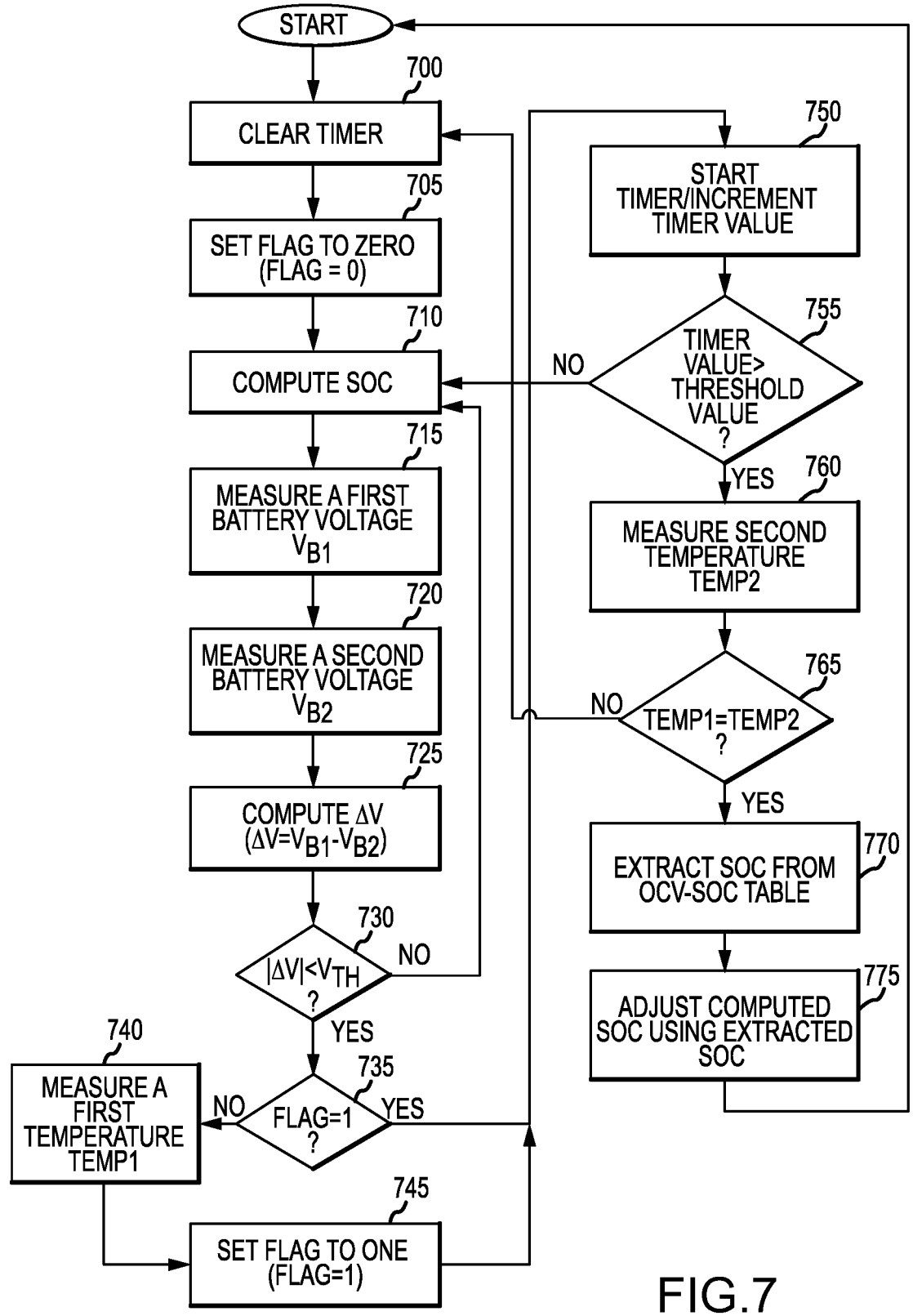
FIG. 7 is a flow chart for adjusting a computed state of charge in accordance with an exemplary embodiment of the present technology.

In addition, the fuel gauge circuit 110 may be configured to store various battery data. For example, the fuel gauge circuit 110 may comprise a memory 130. In an exemplary embodiment, the fuel gauge circuit 110 may store predetermined battery characteristics, such as open circuit voltage values of the battery 101 and corresponding capacity values (i.e., SOC) of the battery 101 (e.g., as illustrated in FIG. 6). The fuel gauge circuit 110 may also store predetermined values, such as a predetermined threshold voltage value $V_{TH}$, a timer threshold value $T_{TH}$ (also referred to as the predetermined time length), and/or other battery characteristic data.

The voltage detector 120 may be configured to measure or otherwise detect the voltage $V_B$ of the battery 101. The voltage detector 120 may be connected to the battery 101 and may comprise any circuit and/or device suitable for measuring a voltage potential.

The current sensor 125 may be configured to measure the current $I_{DD}$ of the battery 101. The current sensor 125 may comprise any circuit and/or device suitable for measuring the current of the battery 101. For example, the current sensor 125 may operate in conjunction with a sense resistor 155, wherein the current senor 125 measures the voltage across the sense resistor 155 to determine the current $I_{DD}$.

The memory 130 may be configured to store the known battery characteristics and/or profile data of the battery 101, such as open circuit voltage characteristics of battery 101. The open circuit voltage characteristics may provide known data indicating a relationship between open circuit voltage $V_{OC}$ values and remaining capacity values (SOC) of the battery 101. The open circuit voltage characteristics may be predetermined by testing the battery 101 under open circuit (i.e., no load) and other conditions and may be stored in a look-up table or any other data storage suitable for storing relational data.

The memory 130 may also store various previously- and currently-computed or measured variables, such as the battery voltage $V_B$, current $I_{DD}$, temperature $V_{TEMP}$ and the like. The memory 130 may also store pre-defined variables, such as the threshold voltage $V_{TH}$ and the timer threshold value $T_{TH}$.

Figure 3:
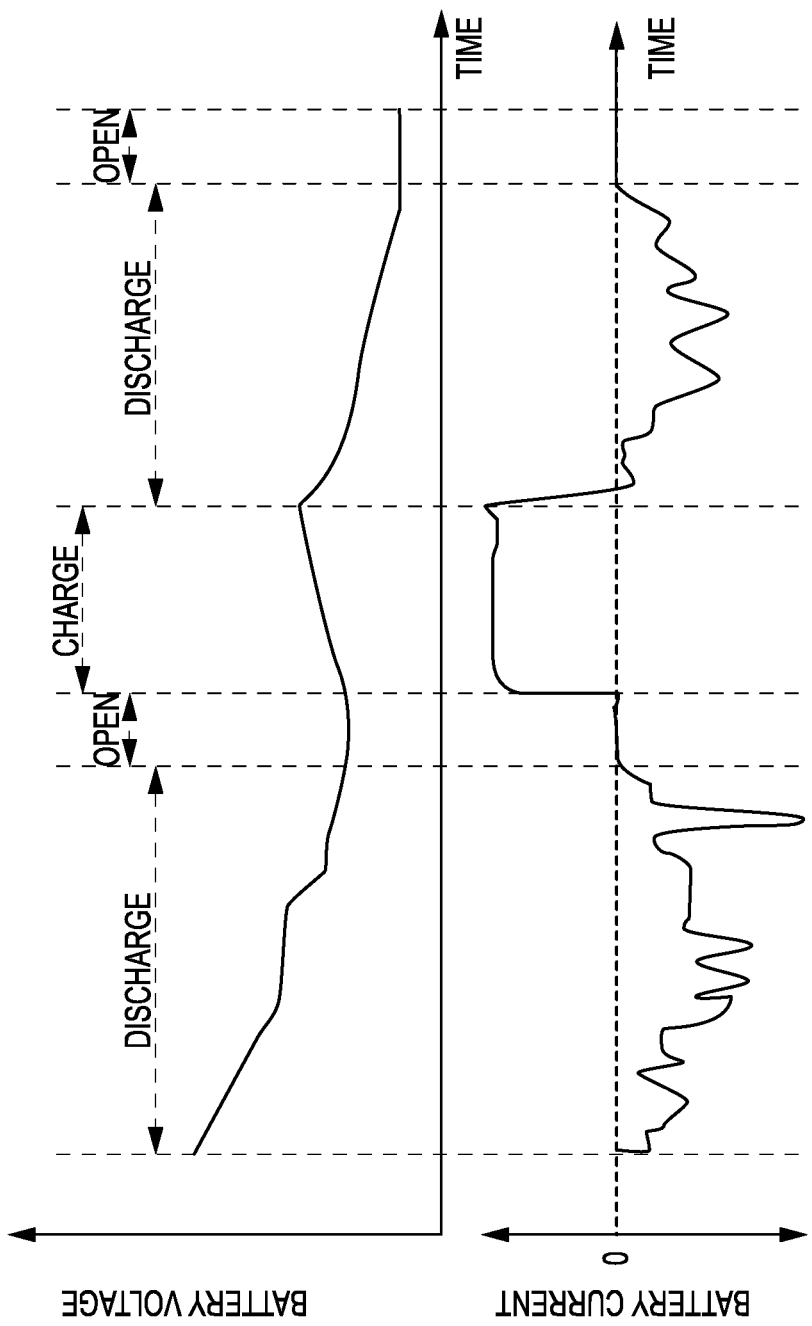
FIG. 3 is graph illustrating battery voltage and battery current in accordance with an exemplary embodiment of the present technology.

The threshold voltage $V_{TH}$ may be selected to detect an open circuit condition/period (also referred to as a relaxed state) and defined by a period in which the battery 101 is neither charging nor discharging. For example, and referring to FIG. 3, the open circuit period may be observed when the battery current is zero (i.e., $I_{DD}=0$) and there is little-to-no change in the battery voltage. In one embodiment, the threshold voltage $V_{TH}$ may be in a range of 0 to 10 mV.

Figure 4:
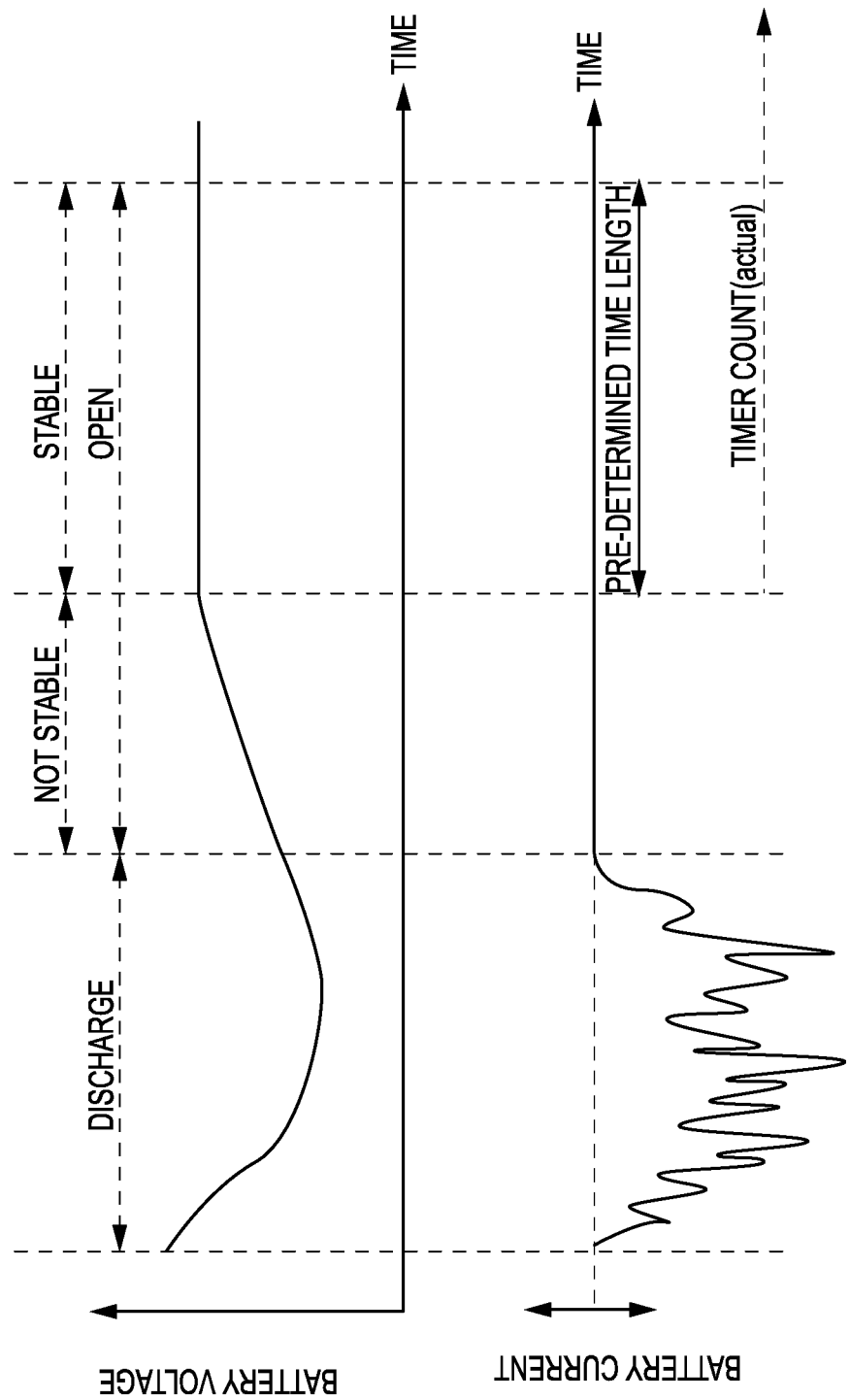
FIG. 4 is a graph illustrating battery voltage and battery current under a first condition and in accordance with an exemplary embodiment of the present technology.

The timer threshold value $T_{TH}$ is a predetermined length of time and may be selected to ensure that the battery 101 has reached a stable state during the open circuit period. For example, and referring to FIGS. 4 and 5, during the open circuit period, the battery voltage may continue to fluctuate (increase or decrease). This fluctuation may be the result of temperature changes of the battery 101 and, in such cases, this period of time is referred to as an unstable state. In other words, the unstable state is defined by a period of time when the battery 101 is in an open circuit condition (because the overall voltage fluctuation is less than the threshold) but continues to increase or decrease due to the temperature of the battery pack 102, the battery 101, and/or ambient air around the battery pack 102 or electric device.

In contrast, the battery 101 is considered to be in the stable state when the battery voltage reaches a plateau and the plateau is maintained for the predetermined length of time. The timer threshold value $T_{TH}$ may be any value and may be selected based on the characteristics of the battery, the intended application, and the like. For example, the timer threshold value may be equal to 600 seconds, 900 seconds, 2400 seconds, etc.

The memory 130 may comprise any number of storage devices, such as registers, a flash memory device, EEPROM (electrically erasable programmable read-only memory), ROM (read only memory), and RAM (random access memory), and the like.

In an exemplary embodiment, the fuel gauge circuit 110 may further comprise a timer 145 configured to measure an elapsed time by incrementing in value according to a clock signal (not shown). Each increment in value may be equivalent to 1 second (s), however the equivalent time value in seconds may be based on the frequency of the clock signal. The timer 145 may comprise any device and/or system suitable for measuring or otherwise counting time and that may be started, stopped, and/or reset at any time.

The processor 135 may perform various computations and comparison, and determine a remaining capacity/state of charge (SOC) of the battery 101. For example, the processor 135 may comprise an SOC calculation circuit 205 (also referred to as the SOC calculator), an SOC extraction circuit 200 (also referred to as the SOC extractor), and an SOC adjustment circuit 210 (also referred to as the SOC adjustor). The processor 135 may be further configured to access various data from the memory 130.

The processor 135 may further comprise a logic circuit 215 to perform arithmetic functions, such as compute a change in voltage (i.e., a difference between two voltage values) and/or a change in temperature (i.e., a difference between two temperature values). The logic circuit 215 may also serve to enable various circuits, such as the timer 145 and the SOC extraction circuit 200. The logic circuit 215 may comprise any number of logic gates, registers, logic circuits, and the like.

In an exemplary embodiment, the logic circuit 215 receives the measured battery voltage $V_B$. The logic circuit 215 may comprise one or more registers (not shown) to store two consecutively-measured voltage values. The logic circuit 215 may be configured to compute the change in the two consecutively measured voltage values.

The logic circuit 215 may be further configured to compare an absolute value of the change in voltage to the predetermined threshold voltage $V_{TH}$. For example, the logic circuit 215 may comprise a comparator to compare the two values. The logic circuit 215 may be configured to set a variable ("flag") to a value such as zero (0) or one (1) if the absolute value of the change in voltage is less than the threshold voltage $V_{TH}$. The value of the flag variable may be stored in a register (not shown).

The logic circuit 215 may be further configured to generate a first enable signal EN1 if the flag is set to one. The logic circuit 215 may transmit the first enable signal to the timer 145, wherein the first enable signal starts operation (i.e., incrementing) of the timer 145.

The logic circuit 215 may be further configured to compare two temperature values, such as a first temperature value $V_{TEMP1}$ and a second temperature value $V_{TEMP2}$. For example, the logic circuit 215 may comprise a comparator to compare the two values. The logic circuit 215 may be further configured to generate a second enable signal EN2 if the first temperature value is equal to the second temperature value and the timer 145 has reached (or exceeded) the threshold value $T_{TH}$. The logic circuit 215 may transmit the second enable signal to the SOC extractor 200.

According to various embodiments, the processor 135 may comprise any number of circuits, systems, logic gates, and/or software to perform the desired computations and/or selections, as described above. For example, the processor 135 may comprise a field programmable gate array, an application specific integrated circuit, programs and operating information, and the like.

The SOC calculator 205 may be configured to compute the remaining capacity ($SOC_{cal}$) of the battery 101 using the detected current $I_{DD}$. For example, the SOC calculator 205 may be configured to integrate the current $I_{DD}$ of the battery 101 over a period of time. This may be accomplished using the current sensor 125 and tracking the current $I_{DD}$ during charging and discharging operations. In the present embodiment, the SOC calculator 205 computes the SOC according to the following:

$$SOC_t = SOC_{t_0} + \int_{t_0}^{\tau} \frac{\eta I}{C_n} dt$$

where $SOC_t$ is the estimated SOC at time t, $SOC_{t0}$ is the initial SOC when the estimation process starts, I is the current ($I_{DD}$), $\eta$ is the current efficiency, and $C_n$ is the nominal capacity of the battery 101. In general, utilizing the current $I_{DD}$ to determine the remaining capacity is referred to as "coulomb counting." The SOC calculator 205 may transmit the computed SOC ($SOC_{cal}$) to the SOC adjustor 210.

The SOC extractor 200 may be configured to generate an extracted SOC ($SOC_{ex}$) based on the voltage $V_B$ and battery characteristic stored in the memory 130. For example, the SOC extractor 200 may receive the voltage $V_B$ and extract the corresponding SOC value from the open circuit voltage characteristics. In an exemplary embodiment, the SOC extractor operates according to the second enable signal EN2 from the logic circuit 215. For example, the SOC extractor 200 may operate only if the second enable signal EN2 is asserted. In the case where the SOC extractor 200 is enabled, the SOC extractor 200 extracts the corresponding SOC value from the memory 130 and transmits the extracted SOC to the SOC adjustor 210. The SOC extractor 200 may comprise any number of circuits, systems, and/or memory devices suitable for identifying an SOC value corresponding to a given voltage value.

The SOC adjustor 210 may receive and store the computed SOC ($SOC_{cal}$) from the SOC calculator 205 and overwrite and/or adjust/correct the computed SOC using a prediction and correction algorithm or using the extracted SOC. The SOC adjustor 210 may output an adjusted SOC ($SOC_{adj}$) and transmit the adjusted SOC to the host system 115. Accordingly, the adjusted SOC ($SOC_{adj}$) may reflect the result of the prediction and correction algorithm or the result of overwriting with the extracted SOC.

In an exemplary embodiment, at various times during operation, the SOC adjustor 210 may receive the extracted SOC from the SOC extractor 200. In such a case, the SOC adjustor 210 may overwrite the computed SOC ($SOC_{cal}$) with the extracted SOC ($SOC_{ex}$). Accordingly, the adjusted SOC ($SOC_{adj}$) transmitted to the host system 115 is same as the extracted SOC ($SOC_{ex}$).

In an exemplary embodiment, when the SOC adjustor 210 has not received the extracted SOC ($SOC_{ex}$), the SOC adjustor 210 may adjust/correct the computed SOC ($SOC_{cal}$) using the prediction and correction algorithm. For example, the SOC adjustor 210 may comprise a Kalman filter (not shown) to adjust the computed SOC ($SOC_{cal}$) by performing a prediction and correction algorithm using one or more battery variables, such as a current and a voltage of the battery. The Kalman filter may be able to minimize, in real time, the errors between estimated and measured outputs, using a feedback that adjusts/corrects the uncertain variables of the model. With this model, the Kalman filter may enable the system to observe physical parameters of the model that cannot be measured directly. Accordingly, the adjusted SOC ($SOC_{adj}$) is the result of correcting the computed SOC ($SOC_{cal}$) using the Kalman filter.

In general, the Kalman filter estimates a process by using a form of feedback control: the filter estimates the process state at some time and then obtains feedback in the form of (noisy) measurements. As such, the equations for the Kalman filter fall into two groups: time update equations and measurement update equations. The time update equations are responsible for projecting forward (in time) the current state and error covariance estimates to obtain the a priori estimates for the next time step. The measurement update equations are responsible for the feedback—i.e. for incorporating a new measurement into the a priori estimate to obtain an improved a posteriori estimate. The time update equations can also be thought of as predictor equations, while the measurement update equations can be thought of as corrector equations. Indeed the final estimation algorithm resembles that of a predictor-corrector algorithm for solving numerical problems.

The Kalman filter may comprise a conventional Kalman filter suitable for performing predictions and corrections based on known and theoretical variables and may be implemented in hardware, software, or a combination thereof.

In various embodiments, the SOC adjustor 210 may further comprise any number of registers to relevant store data, such as the battery voltage $V_B$, current $I_{DD}$, the $SOC_{ex}$ value, the $SOC_{cal}$ value, and the $SOC_{adj}$ value.

The host system 115 may be configured to generate the control signal S1 and control the duty cycle of the control signal S1, which controls the switch 140, and thus control the flow of the charge current from the charger 105 to the battery 101. The control signal S1 may be a pulse-width modulated signal and referred to as a charge pulse.

The host system 115 may comprise any circuit and/or system suitable for generating a pulse-width modulated signal, such as a PMW controller (not shown), a timer (not shown), a waveform generator, flip flops, and the like.

In an exemplary operation, and referring to FIGS. 1-7, the system 100 may determine whether the battery is in an open circuit condition and, if so, extract an SOC value based on a measured voltage and adjust a computed SOC value (using measured current of the battery) according to the extracted SOC value.

In an exemplary operation, the system 100 performs a method for determining a state of charge of the battery 101 comprising clearing the timer value (700). For example, the logic circuit 215 may transmit a signal to the timer 145 to clear the value of the timer 145.

The method may further comprise setting a flag to zero (705), wherein the flag may be a variable that can be defined as zero (0) or one (1). When the flag is set to zero, this indicates that that an open circuit condition does not exist. When the flag is set to one, this indicates that an open circuit condition does exist. For example, the logic circuit 215 may store the flag variable (0 or 1) in a register (not shown) or other programmable memory device and the logic circuit 215 may set the flag variable to zero upon receipt of a start signal (START). In one embodiment, the host system 115 or other controller (not shown) may initiate the logic circuit 215 by transmitting the start signal.

The method may further comprise computing the SOC of the battery 101 (710). For example, the SOC calculator 205 may generate a computed SOC ($SOC_{cal}$) using the measured current of the battery 101, as described above. The SOC calculator 205 may transmit the computed SOC ($SOC_{cal}$) to the SOC adjustor 210.

The method may further comprise measuring a first battery voltage $V_{B1}$ (715). For example, the voltage detector 120 may measure the first battery voltage $V_{B1}$ and transmit the measured first battery voltage $V_{B1}$ to the processor 135, in particular, the SOC extractor 200 and the logic circuit 215.

The method may further comprise measuring a second battery voltage $V_{B2}$ (720) at a time after measuring the first battery voltage $V_{B1}$. For example, the voltage detector 120 may measure the second battery voltage $V_{B2}$ and transmit the measured second battery voltage $V_{B2}$ to the processor 135, in particular, the SOC extractor 200 and the logic circuit 215. The logic circuit 215 and the SOC extractor 200 may be equipped to store both the first and second battery voltage values $V_{B1}$, $V_{B2}$, such as in a storage/memory device suitable for temporarily storing data.

The method may further comprise computing a change in voltage value ΔV (725) using the first and second measured voltages $V_{B1}$, $V_{B2}$. In an exemplary embodiment, the change in voltage is defined as a difference value between the first and second voltages (i.e., $ΔV=V_{B1}-V_{B2}$). For example, the logic circuit 215 may be configured to compute the change in voltage using any number of suitable logic gates. The logic circuit 215 may then generate an absolute value of the change in voltage (|ΔV|).

The method may further comprise comparing the absolute value (|ΔV|) to the predetermined threshold voltage value $V_{TH}$ (730). For example, the logic circuit 215 may determine whether the absolute value (|ΔV|) is less than the predetermined threshold value $V_{TH}$. If not, then the logic circuit 215 may conclude that the open circuit condition does not exist, and the system 100 may continue to compute the SOC using the SOC calculator 205 and measuring new battery voltages using the voltage detector 120.

If the absolute value (|ΔV|) is less than the predetermined threshold value $V_{TH}$, then the logic circuit 215 may determine the value of the flag variable. If the flag variable is set to zero, then the method may comprise measuring a first temperature value TEMP1 (740), and setting the flag variable to one (745). For example, the thermistor 150 may provide the first temperature value in the form of a voltage (e.g., Vtemp), and the logic circuit 215 may change the flag variable from zero to one. If the flag variable is already set to one, then the logic circuit 215 may start the timer 145, such that the timer 145 begins to increment (750).

The method may further comprise determining if the timer value is greater than the timer threshold value $T_{TH}$. For example, the logic circuit 215 may perform a comparison of the two values. If the timer value is greater than the timer threshold value, then the system 100 may measure a second temperature TEMP2 (760). For example, the thermistor 150 may provide the second temperature value in the form of a voltage (e.g., Vtemp). If the timer value is not greater than the timer threshold value $T_{TH}$, then the system 100 may clear the timer 145 and restart the process.

The method may further comprise comparing the first temperature TEMP1 to and second temperature TEMP2 (765). For example, the logic circuit 215 may perform a comparison of the two values.

If the first temperature TEMP1 is not equal to the second temperature TEMP2, then the battery 101 may be considered to be in the unstable state and therefore, the SOC extractor 220 is not enabled to extract an SOC value from the memory 130. In such a case, the logic circuit 215 may repeat steps 700 through 765 until the first and second temperatures are equal to each other and the battery 101 is considered to be in the stable state. For example, and referring to FIG. 4, the battery 101 enters an open circuit condition, but because the battery voltage is not substantially constant (presumably due to temperature changes), the timer 145 is initially cleared (reset) and the timer 145 is restarted once the timer value is greater than the timer threshold value $T_{TH}$ and there are no changes in the temperature (i.e., TEMP1=TEMP2). In other words, the timer 145 restarts when the battery 101 enters the stable state.

Figure 5:
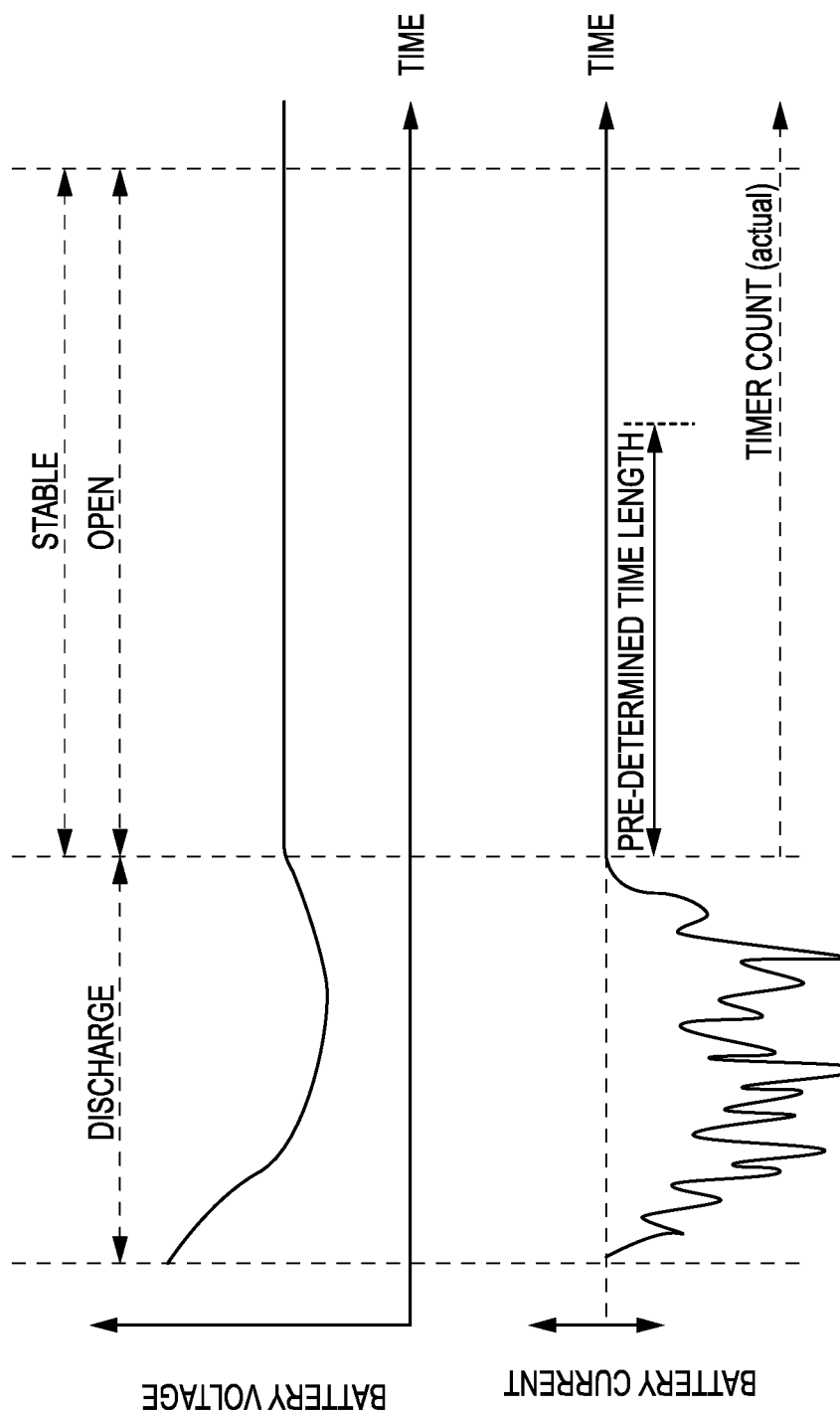
FIG. 5 is a graph illustrating battery voltage and battery current under a second condition and in accordance with an exemplary embodiment of the present technology.

In contrast, and referring to FIG. 5, the battery voltage does not fluctuate due to temperature changes during the open circuit condition and therefore is stable for the duration of the open circuit period. Accordingly, the timer 145 is started when the open circuit condition is detected.

If the first temperature TEMP1 is equal to the second temperature TEMP2, then the logic circuit 215 may enable the SOC extractor 200 to use the most-recently measured battery voltage $V_B$ to extract a corresponding SOC value from the memory 130 (770). For example, and referring to FIG. 6, if the most-recently measured voltage is 3.7V, then the corresponding SOC is 70%. In such a case, the SOC extractor 200 transmits the extracted SOC (e.g., $SOC_{ex}$=70%) to the SOC adjustor 775.

The method may further comprise adjusting the computed SOC ($SOC_{cal}$) using the extracted SOC ($SOC_{ex}$). For example, in one embodiment, upon receiving the extracted SOC ($SOC_{ex}$), the SOC adjustor 210 may overwrite any computed SOC ($SOC_{cal}$) (that is stored in the SOC adjustor 210) with the extracted SOC. In such a case, the extracted SOC ($SOC_{ex}$) is output as the adjusted SOC ($SOC_{adj}$). In other words, $SOC_{adj}=SOC_{ex}$.

In other embodiments, the SOC adjustor 210 may adjust/correct the computed SOC ($SOC_{cal}$) according to the extracted SOC ($SOC_{ex}$). For example, the SOC adjustor 210 may decrease the computed SOC ($SOC_{cal}$) by a factor k if the extracted SOC ($SOC_{ex}$) is less than the computed SOC ($SOC_{cal}$) and may increase the computed SOC by the factor k if the extracted SOC ($SOC_{ex}$) is greater than the computed SOC v. For example, the adjusted SOC ($SOC_{adj}$) may be computed according to the following: $SOC_{adj}=(1-k)(SOC_{cal})+k(SOC_{ex})$.

In various embodiments, the SOC adjustor 210 may then transmit the adjusted SOC ($SOC_{adj}$) to the host system 115.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus capable of connecting to a battery, comprising:
   a voltage detector configured to measure a voltage of the battery;
   a temperature sensor to measure a temperature of the battery;
   a memory configured to store battery characteristic data indicating a relationship between open circuit voltage values and state of charge; and
   a processor configured to:
      compute a change in voltage using the measured voltage;
      determine whether an open circuit condition exists according to the computed change in voltage;
      compute a first state of charge of the battery;
      compare two consecutively-measured temperatures;
      extract a second state of charge from the memory according to the measured voltage if:
         the open circuit condition exists for a predetermined length of time; and
         the two consecutively-measured temperatures are equal in value; and
      adjust the computed first state of charge using the extracted second state of charge.

2. The apparatus according to claim 1, wherein computing the first state of charge comprises integrating a current of the battery over a period of time.

3. The apparatus according to claim 1, wherein determining whether the battery is in the open condition comprises:
   computing a change in voltage of two consecutively measured voltage values; and
   comparing the change in voltage to a threshold voltage value.

4. The apparatus according to claim 1, wherein adjusting the computed first state of charge comprises:
   decreasing the first state of charge if the second state of charge is less than the first state of charge; and
   increasing the first state of charge if the second state of charge is greater than the first state of charge.

5. The apparatus according to claim 1, wherein adjusting the computed first state of charge comprises overwriting the first state of charge with the second state of charge.

6. The apparatus according to claim 1, further comprising a timer responsive to the processor, wherein the timer generates a timer value representing elapsed time.

7. The apparatus according to claim 6, wherein the processor starts the timer only if the open circuit condition exists.

8. A method for determining a state of charge of a battery, comprising:
   measuring a voltage of the battery;
   detecting a current of the battery;
   determining whether an open condition exists using the measured voltage;
   measuring a first temperature of the battery;
   measuring a second temperature of the battery later in time relative to measuring the first temperature;
   comparing the first and second temperatures;
   incrementing a timer value if the open condition exists;
   comparing the timer value to a threshold timer value;
   computing a first state of charge using the detected current;
   extracting a second state of charge from a set of known battery data using the measured voltage if:
      the timer value is greater than the threshold timer value; and
      the first temperature is substantially equal to the second temperature;
   and
   overwriting the first state of charge with the second state of charge.

9. The method according to claim 8, wherein the battery is in the open condition when the battery is neither charging nor discharging.

10. The method according to claim 8, wherein determining whether the battery is in the open condition comprises:
   computing a change in voltage of two consecutively measured voltage values; and
   comparing the change in voltage to a threshold voltage value.

11. The method according to claim 10, wherein the battery is in the open condition if an absolute value of the change in voltage is less than the threshold voltage value.

12. The method according to claim 8, wherein computing the first state of charge comprises integrating the measured current over a period of time.

13. A system, comprising:
   a battery; and
   a fuel gauge connected to the battery and comprising:
      a voltage detector configured to measure a voltage of the battery;

a current sensor configured to detect a current of the battery;

a memory for storing a look-up table comprising relational battery data;

a temperature sensor configured to generate temperature data of the battery;

a processor connected to the voltage detector, the current sensor, and the memory, wherein the processor comprises:

a logic circuit configured to:

compute a change in voltage using the measured voltage;

compare first temperature data to second temperature data;

generate a first enable signal based on the computed change in voltage; and generate a second enable signal based on the comparison of the first and second temperature data;

a first sub-circuit configured to compute a first state of charge using the detected current;

a second sub-circuit responsive to the second enable signal and configured to extract a second state of charge from the memory using the measured battery voltage; and a third sub-circuit configured to:

receive the first state of charge;

receive the second state of charge; and adjust the first state of charge using the second state of charge; and a timer responsive to the first enable signal and configured to generate timer value.

14. The system according to claim 13, wherein the relational battery data comprises open circuit voltage values and corresponding state of charge values.

15. The system according to claim 13, wherein computing the first state of charge comprises integrating the detected current over a period of time.

16. The system according to claim 13, wherein adjusting the first state of charge comprises:

decreasing the first state of charge if the second state of charge is less than the first state of charge; and increasing the first state of charge if the second state of charge is greater than the first state of charge.

17. The system according to claim 13, wherein adjusting the computed first state of charge comprises overwriting the first state of charge with the second state of charge.

18. The system according to claim 13, wherein the logic circuit generates the first enable signal only if an absolute value of the computed change in voltage is less than a threshold voltage value, wherein the enable signal indicates that an open circuit condition exists.

19. The system according to claim 13, wherein the timer starts upon receipt of the first enable signal.

20. The system according to claim 13, wherein the logic unit generates the second enable signal only if:

the timer value reaches a threshold value; and the first temperature data is equal to the second temperature data.

* * * * *